(12) United States Patent
Minano et al.

(10) Patent No.: US 8,879,253 B2
(45) Date of Patent: Nov. 4, 2014

(54) TRANSPARENT HEAT-SPREADER FOR OPTOELECTRONIC APPLICATIONS

(75) Inventors: Juan Carlos Minano, Madrid (ES); Pablo Benitez, Madrid (ES)

(73) Assignee: Light Prescriptions Innovators, LLC, Altadena, CA (US)

( * ) Notice: Subject to any disclaimer, the term of this patent is extended or adjusted under 35 U.S.C. 154(b) by 1126 days.

(21) Appl. No.: 12/866,546

(22) PCT Filed: Feb. 3, 2009

(86) PCT No.: PCT/US2009/000710
§ 371 (c)(1),
(2), (4) Date: Nov. 16, 2010

(87) PCT Pub. No.: WO2009/099605
PCT Pub. Date: Aug. 13, 2009

(65) Prior Publication Data
US 2011/0044000 A1  Feb. 24, 2011

Related U.S. Application Data

(60) Provisional application No. 61/063,964, filed on Feb. 6, 2008.

(51) Int. Cl.
*H05K 7/00* (2006.01)
*H01L 33/64* (2010.01)

(52) U.S. Cl.
CPC .................................. *H01L 33/648* (2013.01)
USPC ........... 361/698; 361/699; 362/101; 362/267; 362/294

(58) Field of Classification Search
USPC ........... 361/698, 699; 362/101, 267, 294, 373
See application file for complete search history.

(56) References Cited

U.S. PATENT DOCUMENTS

| 4,045,246 | A | 8/1977 | Mlavsky et al. | 136/89 |
|---|---|---|---|---|
| 4,137,097 | A | 1/1979 | Kelly | 136/89 |
| 5,890,794 | A | 4/1999 | Abtahi et al. | 362/294 |
| 6,490,389 | B1 | 12/2002 | Goodwin et al. | 385/27 |
| 6,689,241 | B1 | 2/2004 | Delhorme et al. | 156/109 |
| 6,815,274 | B1 | 11/2004 | Hsieh et al. | 438/180 |
| 7,108,400 | B2 | 9/2006 | Yamada et al. | 362/294 |
| 7,138,659 | B2 | 11/2006 | Raos et al. | 257/79 |
| 7,219,715 | B2 | 5/2007 | Popovich | 165/80.4 |
| 7,285,445 | B2 | 10/2007 | Owen et al. | 438/116 |
| 7,288,796 | B2 | 10/2007 | Dry | 257/88 |
| 7,315,049 | B2 | 1/2008 | Raos et al. | 257/99 |
| 7,331,691 | B2 * | 2/2008 | Livesay et al. | 362/294 |
| 8,143,769 | B2 * | 3/2012 | Li | 313/46 |
| 8,444,283 | B1 * | 5/2013 | Miller et al. | 362/101 |
| 2006/0176699 | A1 | 8/2006 | Crunk | 362/294 |
| 2010/0103678 | A1 * | 4/2010 | Van De Ven et al. | 362/294 |

FOREIGN PATENT DOCUMENTS

| JP | 2001-036148 A | 2/2001 |
|---|---|---|
| JP | 2005-079149 A | 3/2005 |
| JP | 2007-287981 A | 11/2007 |

* cited by examiner

*Primary Examiner* — John A Ward
(74) *Attorney, Agent, or Firm* — Drinker Biddle & Reath LLP

(57) ABSTRACT

An optoelectronic cooling system is equally applicable to an LED collimator or a photovoltaic solar concentrator. A transparent fluid conveys heat from the optoelectronic chip to a hollow cover over the system aperture. The cooling system can keep a solar concentrator chip at the same temperature as found for a one-sun flat-plate solar cell. Natural convection or forced circulation can operate to convey heat from the chip to the cover.

18 Claims, 7 Drawing Sheets

TRANSPARENT HEAT-SPREADER FOR OPTOELECTRONIC APPLICATIONS

CROSS REFERENCE TO RELATED APPLICATIONS

This application claims benefit of U.S. Provisional Patent Applications No. 61/063,964, filed Feb. 6, 2008 in the names of Miñano et al.

STATEMENT REGARDING FEDERALLY FUNDED RESEARCH AND DEVELOPMENT

This invention was supported in part by US Department of Energy Contract number DE-FC36-07G017052 "Solar American Initiative." The U.S. Government may have certain rights in this invention.

TECHNICAL FIELD

The present application relates generally to light concentration and illumination, and more particularly to LEDs, semiconductor lasers, solar cells, and optics for concentrating or collimating light. It discloses cooling systems utilizing a transparent fluid and passages within a transparent outer cover.

TECHNICAL BACKGROUND

In many optical devices, including light sources such as LEDs and semiconductor lasers and light collectors such as solar voltaic cells, it is in general desirable to limit the operating temperature in order to keep the conversion efficiency at high levels. For this purpose, it is often desirable to extract heat from an optoelectronic device (LED, laser, or solar cell). For this purpose a metallic heat spreader with radiator fins can be attached to the optoelectronic device, but will block light. Consequently, the light going to or from the device should not intercept the heat sink, else it will be wasted heating the heat sink. This condition precludes the use of some optical designs, such as the XR (defined in U.S. Pat. No. 6,639,733, which is incorporated herein by reference in its entirety). In general, an XR configuration has a reflective surface (X) followed by a refractive surface (R), and the optoelectronic device is typically placed approximately in the aperture of these optical designs (which is where the light enters or exits the optical system). Thus an opaque heat sink would block the light flow. Although the optoelectronic device is typically small compared to the aperture, and so blocks little of the light flow, an attached heat sink large enough to be useful is typically not so small. The reason for the optoelectronic device being smaller than the optical system aperture is the very function of the optical system, transforming nearly hemispheric light going to or from the optoelectronic device into a more nearly collimated beam that is necessarily much larger, because of etendue conservation. That is, for this transformation to be efficiently done requires that the cross-section area of the collimated beam (i.e., the area of the aperture) be larger than the area of the hemispheric light, which is in fact the emitting or receiving area of the optoelectronic device.

Optical designs that are precluded by an opaque heat sink (such as the XR) have a mirror whose size is similar to that of the aperture. These optical designs are convenient for several reasons: a compact aspect ratio, high effectiveness over large wavelength ranges, and potentially low cost. The present system allows these optical designs to be used with heat extraction apparatus. This is important because the XR concentrator is a candidate for large-scale solar-power deployment, and several in particular are the subject of patent applications by the same inventors: U.S. patent application Ser. No. 12/206,547 filed Sep. 8, 2008 titled "Multi-Junction Solar Cells With a Homogenizer System and Coupled Non-imaging Concentrator", U.S. patent application Ser. No. 11/997,142 filed Jun. 30, 2008 (publication No. U.S. 2008-316761 A1) titled "Free-Form Lenticular Optical Elements and their Application to Condensers and Headlamps and corresponding WO 2007/016363; and U.S. patent application Ser. No. 12/075,830 filed Mar. 14, 2008 (publication no. U.S. 2008-0223443 A1) titled "Optical Concentrators, Especially for Solar-Photovoltaics" and incorporated by reference in their entirety.

SUMMARY OF THE INVENTION

As will be shown, the area required for heat extraction at a reasonable temperature drop is similar to the aperture area of the optical system for typical photovoltaic and illumination applications. In light of this fact the inventors hereby propose that reflective optical device systems such as the XR have a specialized transparent cover deployed across the aperture and in thermal contact with the heat source. The special cover is formed by a double glazing with a transparent fluid therebetween. The fluid is completely enclosed so that the double glazing is sealed along its boundaries, creating an enclosed volume. The function of the fluid is to convey the heat away from its source, i.e., the cover acts as a heat spreader, and thus hereinafter termed the Heat Spreading Transparent Cover (HSTC). Various preferred embodiments are disclosed that spread the heat more efficiently over the cover (active circulation of the fluid in the cover, phase change, insertion of metallic heat spreaders at the heat source base) as well as to eject this heat more efficiently to the ambient environment (external cooling circuit, and external active cooling). For that purpose we propose using a transparent, dielectric fluid (electric insulator) in which the optoelectronic device is immersed on at least one side. The optoelectronic device typically needs additional power conditioning, control, or other electronic circuits, such DC/DC or DC/AC converters for solar cells and drivers for LEDs and Lasers. These additional circuits may also be immersed in the same (or another) dielectric fluid. Examples of candidate fluids for this application are silicone oils, mineral oils used in the food industry and medicine and gases, particularly air at high pressure.

Optical Aperture Area Suffices To Send Heat To Ambient Environment

In most of the abovementioned applications, the optical aperture area would suffice to transfer to the ambient atmosphere or other environment, at a reasonable temperature drop, the heat extracted from the optoelectronic device. In a photovoltaic concentrator, the power received by the photovoltaic cell is less than that received by a flat panel (no concentration) solar cell of the same area as the concentrator aperture, since no concentrators has 100% efficiency (a good system can attain 75-80%). Moreover, concentrators usually cannot deliver the diffuse component of solar radiation, which accounts for 20-30% of the annular insolation on a tracking aperture. This diffuse component misses the cell and is generally either sent back to sky or absorbed by other parts of the concentrator, thus not producing heat at the cell. Of course, the electricity generated by the cell means correspondingly less heat, especially for the high-efficiency cells usually used in concentrators (30% to 40% efficient, vs. 15% for less expensive one-sun cells). All these factors together make the heat load in the concentrator cell typically only half that of a conventional one-sun cell the same size.

Because of their relatively low heat density, conventional one-sun (no concentration) modules do not use heat sinks, which would greatly add to cell costs. These cells typically run 25° C. over ambient temperature, exchanging heat with the ambient environment through both faces (half over the aperture, half through the back) of the module plate. Thus the thermal load of a concentrator cell, which is only half the load of a one-sun flat cell, can be exchanged with the ambient air over a single surface similar in size to the aperture while keeping the same cell-to-ambient temperature drop. This calculation assumes that the heat generated at the cell is spread efficiently over the aperture surface, i.e., ideally this surface would be isothermal and at the cell temperature. In practice, thermal resistance between this surface and the cell is not zero, but with the presently proposed systems can be kept sufficiently low. The cell temperature in this case will be low enough to keep solar cell efficiency at the customary levels that are acceptable by most of present solar-cell technologies.

An LED automotive high beam is a demanding LED application, not only for the many lumens required but due to the demand for the highest possible brightness, which translates directly to figuring out what is the highest possible density of heat removal (as with solar cells, LED longevity and efficiency both improve as operating temperature is reduced). A typical automotive high beam lamp puts 1000 lumens on the road, with a hot spot as much as 65,000 candela. The maximum candlepower must be divided by the chip's luminance in candela/mm$^2$ (a value of 17 is typical) and by optical efficiency (typically 60% when including the cover lens) to give the minimum aperture area (here 114 cm$^2$). Typical high beam apertures are larger, 120 cm$^2$ or more.

The heat power of an LED may be about 87% of the electric power. This assumes an LED efficiency of 38 lm/W (this is the number of lumens got per electric watt given to the LED) and a spectral distribution giving 300 lm per Watt of light power. The heat power generated to get 1000 lm is then 23 W.

If 23 W of heat power is spread over the minimum aperture area, the heat power-density is 23/114×10$^{-4}$=2016 W/m$^2$, 2.4 times greater than that of a one-sun photovoltaic module under standard conditions (850 W/m$^2$). If the power is spread over the typical aperture area (120 cm$^2$) then the power density decreases to 23/120×10$^{-4}$=1915 W/m$^2$, which is about 2.25 times the heat power generated by a one-sun conventional photovoltaic module. Thus the temperature drop over ambient will be in the range of 2.25 to 2.5 times the temperature drop got in one-sun PV modules (which is about 25 degrees in standard conditions), provided there is good heat spread over the aperture.

In automotive applications heat flows from the engine, which is usually the biggest heat source of the vehicle, to ambient. In a car, the engine is usually at the front of the vehicle, and the headlamps are then typically mounted at the front of the engine compartment. This means that the direction of global heat flow in the head lamps is from inside to outside. Optical and thermal head lamp designs should not oppose this global heat flow. In lens based designs in which the LED is in the back of the lamp, nearest the engine, a conventional heat sink on the back of the LED would be at a disadvantage, because it would be attempting to dissipate heat towards the hot engine. Such designs often need vents to extract heat from the LED. Sometimes the hot air is sent to the engine, which at the same time sends a significant heat flow to the ambient. The present system, in contrast, can extract the heat from the LED without opposing the general heat away flow from the engine.

BRIEF DESCRIPTION OF THE DRAWINGS

The above and other aspects, features and advantages of the present invention will be more apparent from the following more particular description of embodiments thereof, presented in conjunction with the following drawings wherein.

DETAILED DESCRIPTION OF THE DRAWINGS

Figure 1:
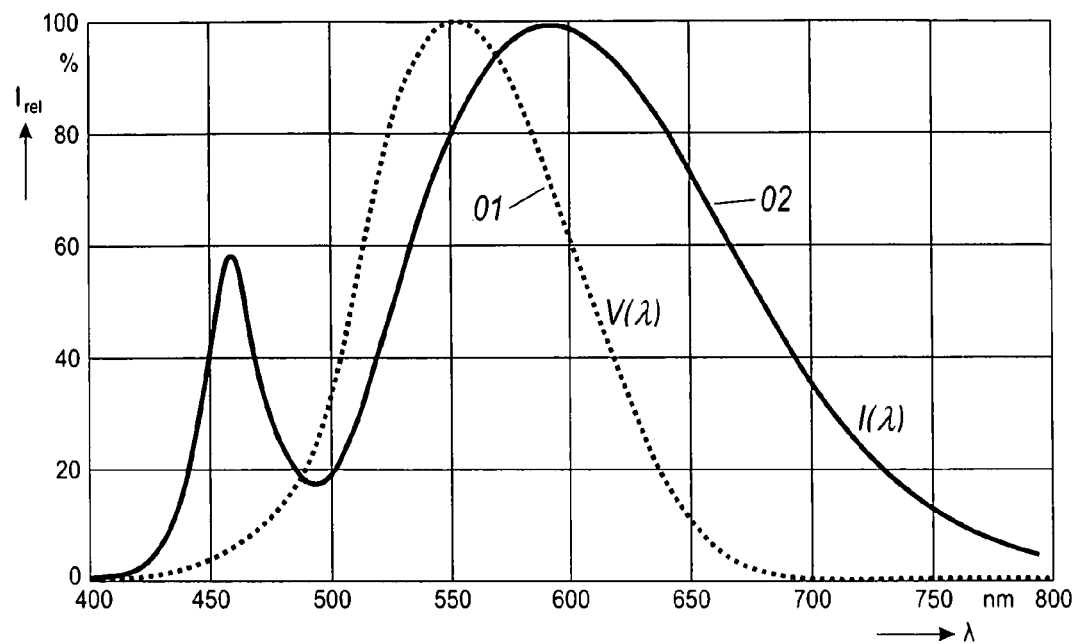
FIG. 1 shows an LED emission pattern

FIG. 1 shows the emission pattern I(λ) of an LED (OSRAM, Power TOPLED long life, Enhanced optical Power LED (ThinGaN), LCW E6SG), given by curve 02. Curve 01 is the luminosity function V(λ). Both curves are normalized and given as a function of wavelength λ. The total light power of a source emitting pattern 02 is proportional to $\Phi=\int I(\lambda)d\lambda$. On the other hand, the corresponding luminous output is proportional to $\Phi_V=683\int I(\lambda)V(\lambda)d\lambda$. The ratio $\Phi_V/\Phi$ gives us the Lumens per Watt of light for this emission pattern. In this case it is about 300 lm per Watt of light. For this same LED, and according to the manufacturer, the typical optical efficiency is 38 lm per electrical Watt for a color temperature of 3500 K. Therefore, per electrical Watt, these 38 lm correspond to 38/300=0.127 W of light being emitted. The remaining 0.873 W are dissipated as heat, or about 87% of the electrical energy is dissipated as heat, while 13% is emitted as light. Therefore, to generate 38 lm of light, 0.873 W of energy are dissipated as heat. To generate 1000 lm of light at the same efficiency, 23 W of energy must be dissipated as heat.

Figure 2:
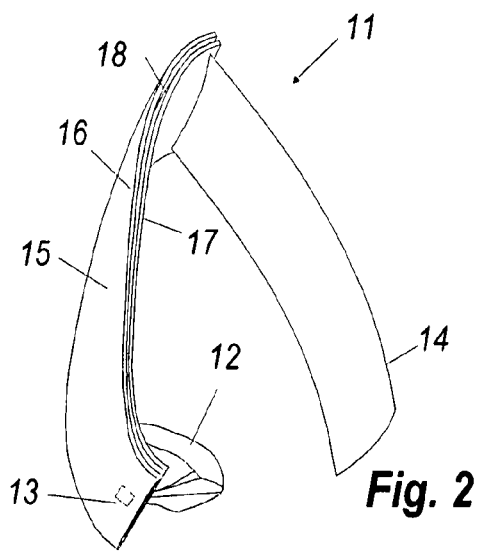
FIG. 2 shows a perspective view of a head lamp for automotive applications.
Figure 3:
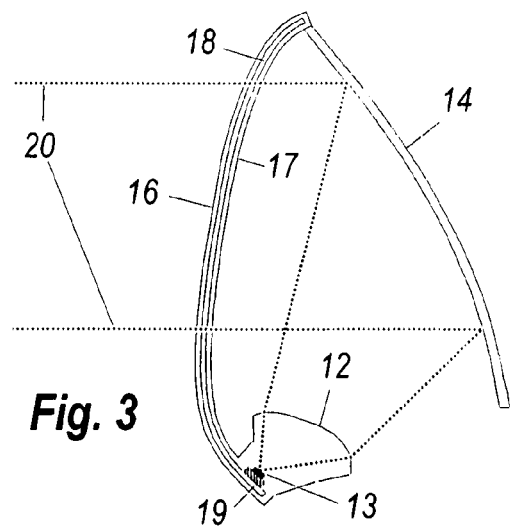
FIG. 3 shows a cross-section of the lamp shown in FIG. 2.

FIG. 2 shows a perspective view of, and FIG. 3 shows a cross-section view of, a preferred embodiment, high-beam head lamp 11 for automotive applications, having an XR configuration comprising mirror 14, secondary refractive body 12, which contains the light source (LED) 13, and cover 15. The light 20 emitted by the source is refracted by the surface of secondary optic 12, and then is reflected at the mirror 14. After this reflection, the light crosses the cover 15, which is formed by two panes of transparent material 16 and 17, defining between them a cavity 18 that contains a fluid.

The cover 15 has no optical function, but instead cools LED 13, which is attached to it. The panes 16 and 17 may have a slight optical effect if they are curved. Any such effect can be corrected for in the design of the optical surfaces 12 and 14 if necessary.

The attachment of the LED to the cover is more clearly seen in the cross section shown in FIG. 3. The light source (LED chip) 13 is attached to a small metallic heat spreader 19, which provides a first heat spreading as it transports the heat to the fluid in the cavity 18. The refractive body 12 is continuous with the inner transparent pane 17. The rear face of the heat spreader 19 is exposed at the rear face of the refractive body 12, and is thus in direct thermal contact with the fluid in the cavity 18. Alternatively, the heat spreader 19 may be encapsulated within the refractive body 12, so as to avoid the risk of fluid penetration at the interface between the heat spreader 19 and the refractive body 12. The heat spreader 19 is then sufficiently close to the rear face of the refractive body 12 to preserve effective thermal contact and transmission between the refractive body 12 and the fluid in the cavity 18.

Figure 4:
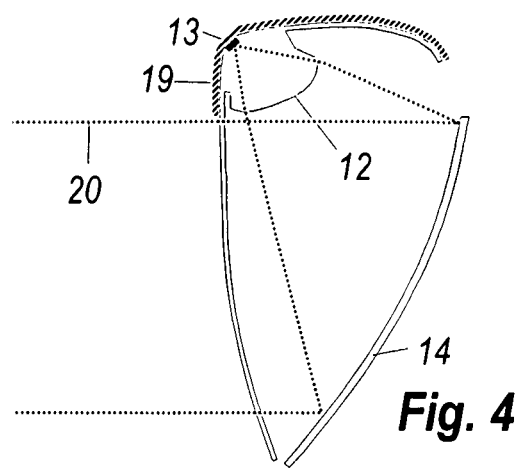
FIG. 4 shows a cross-section of another, similar lamp.

FIG. 4 shows another XR free-form design in which the heat source (optoelectronic device 13) is on the upper part of the device, allowing a relatively large, opaque heat spreader 19 to extend over the space between the top of mirror 14 and the top of cover 15. Heat can then escape upwards from the opaque heat spreader 19. In this case the heat from the LED to the ambient is not flowing opposite to the general heat flow, but not parallel to it either. The opaque heat spreader 19 of FIG. 4 can be combined with the cover 15 formed as a transparent heat spreader 16, 17, 18, as shown in FIGS. 2 and 3.

Figure 5:
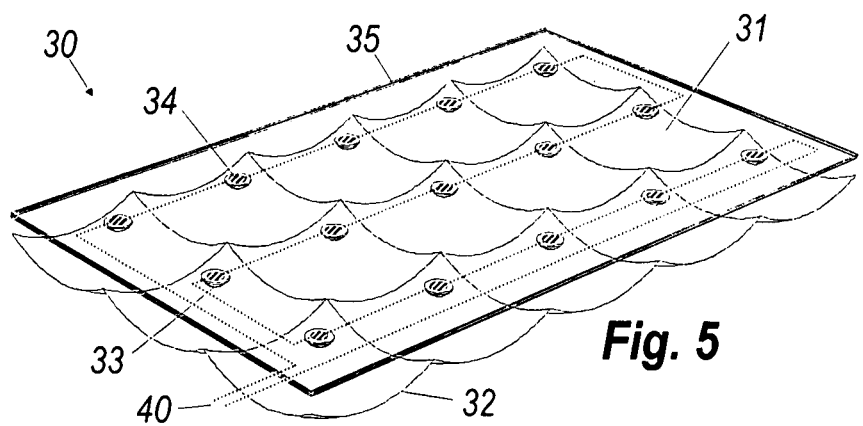
FIG. 5 shows a perspective view of a photovoltaic concentrator array.
Figure 6:
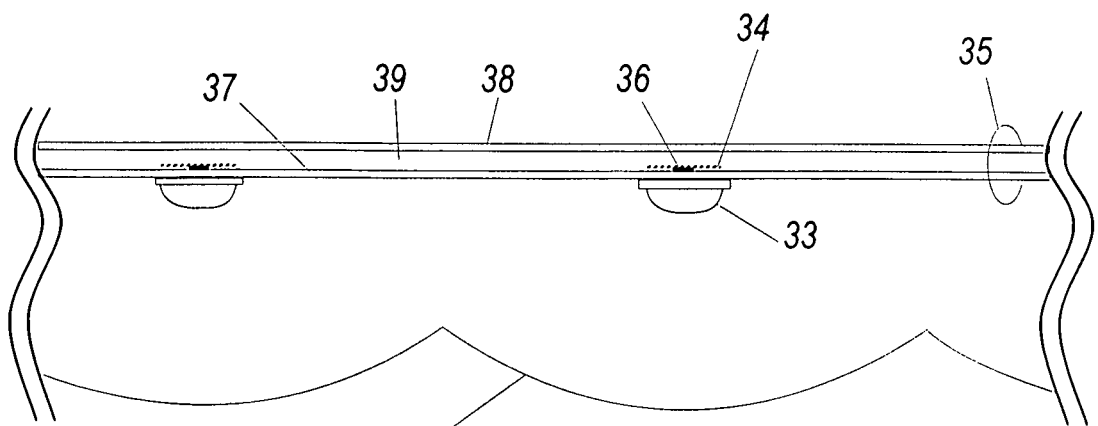
FIG. 6 shows a partial side view of the array shown in FIG. 5.
Figure 7:
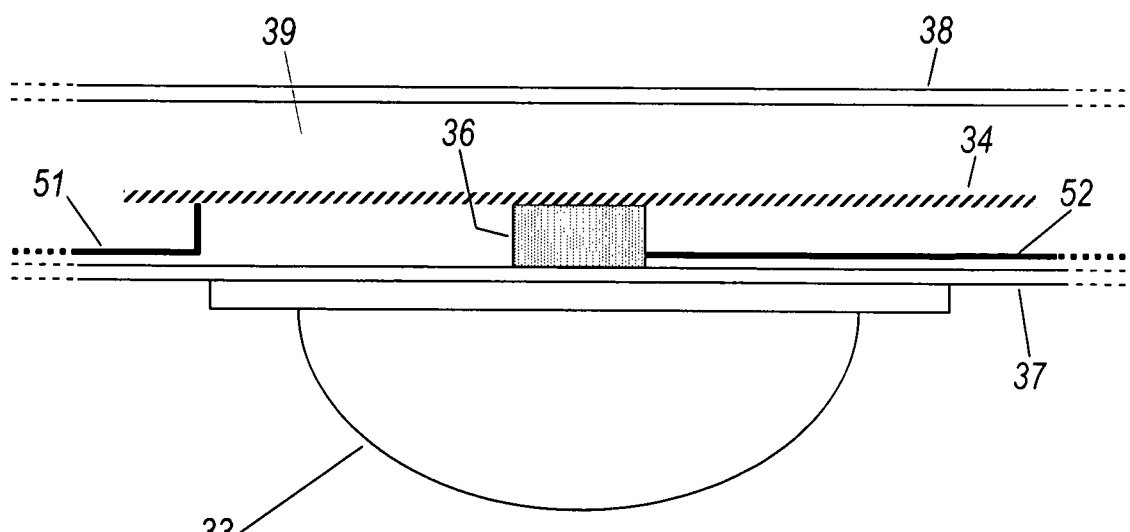
FIG. 7 shows the details of a solar cell in one form of the array of FIG. 5.
Figure 8:
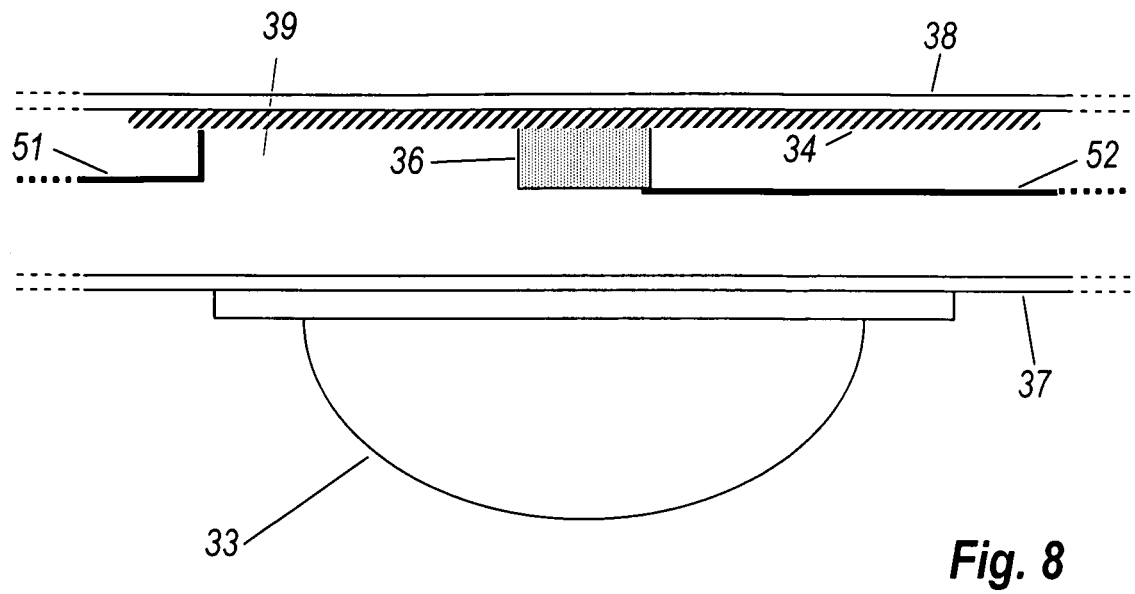
FIG. 8 shows a view similar to FIG. 7 of another form of the array of FIG. 5.

FIGS. 5 and 6 show one embodiment of a photovoltaic concentrating array 30 of XR concentrators 31, of which FIGS. 7 and 8 show two detailed forms. Each XR concentrator 31 comprises a lower mirror 32 which reflects incoming light, for example, the sun's rays (not shown) falling from above as shown in FIG. 5, upwards towards a secondary element 33, which refracts the rays onto the solar cell 36, see FIG. 6. The back side of the solar cell 36 is attached to a metallic heat spreader 34. Secondary element 33 plus the cell and the metallic heat spreader 34 are attached to the inner side of the cover 35, as shown by the side view in FIG. 6. Wires 40 connect all the cells providing a power output for the concentrator array.

FIG. 6 shows to a larger scale than FIG. 5 a cross-section view of part of the array of photovoltaic XR concentrators 30, showing specifically the mirror 32, the secondary element 33, metallic heat spreader 34, cover 35, and solar cell 36 encapsulated between secondary element 33 and metallic heat spreader 34. The cover 35 is formed by two flat panes 37 and 38 and the cavity 39 formed therebetween, containing a heat-spreading fluid.

FIG. 7 shows the detail of the electrical connections of a solar cell. It is connects in series to other cells by wires 51 and 52. A wire 40 shown in FIG. 5 as connecting two cell assemblies 33-36 in FIG. 5 may be a wire 51 of FIG. 7 at one end, and a wire 52 of FIG. 7 at the other end. Wire 51 may be connected to the cell 36 or to the heat sink 34, which is then attached directly to the cell so as to form an electrical connection. The fluid contained between transparent flat panes 37 and 38 is chosen to be an electrical insulator. Heat sink 34 is then electrically isolated by the fluid, which also insulates wires 51 and 52, saving the cost of solid electrical insulation.

FIG. 8 shows a similar arrangement in which the heat spreader 34 is in contact with the outer wall 38 of the cavity in order to improve heat extraction to the environment. The shape of the secondary element 33 is adjusted to allow for the space between the secondary element and the cell 36. For greater mechanical rigidity in FIG. 8, the wire 52 may be carried across the cavity and secured to the inner wall 37 away from the heat sink 34.

Figure 9:
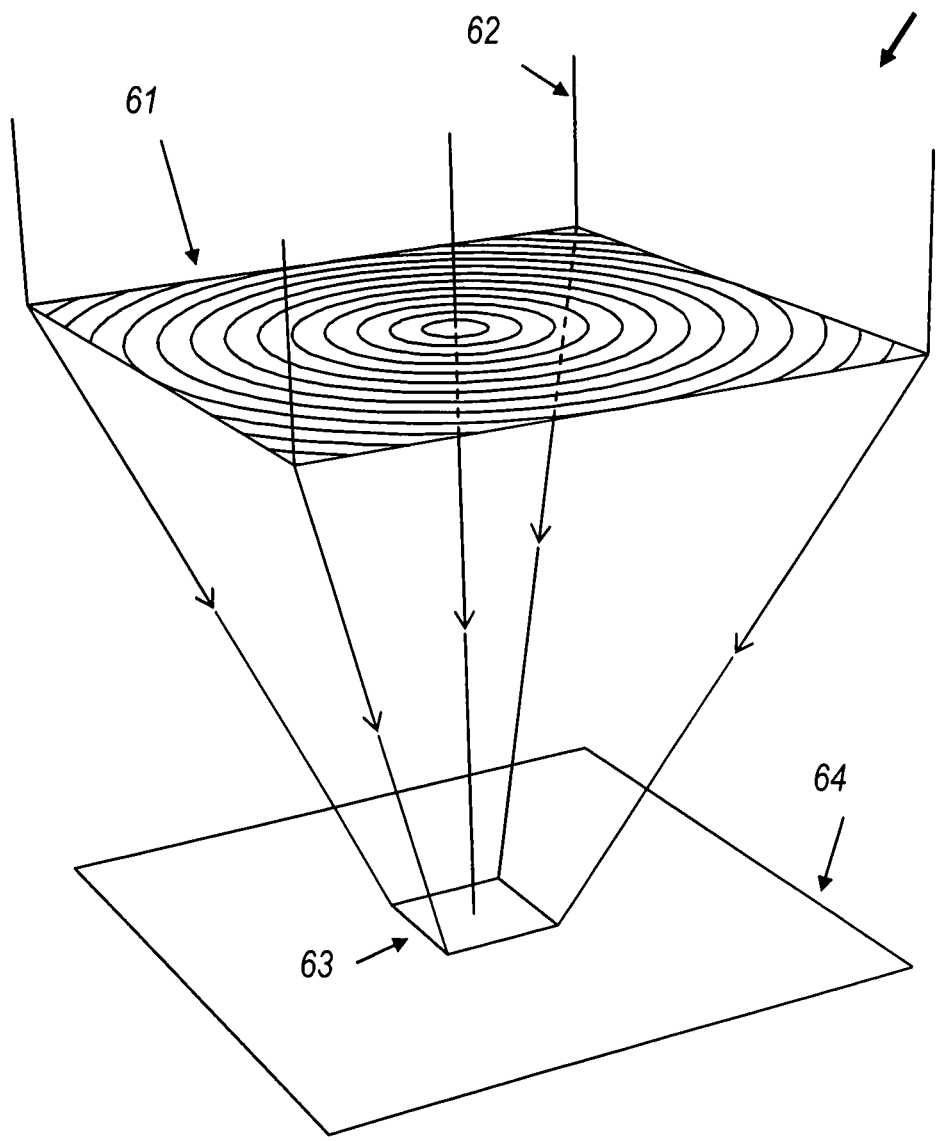
FIG. 9 shows a solar concentrator and its receiver.

FIG. 9 shows a solar concentrator 61 concentrating incoming light 62 onto a receiver 63. This optic covers an area 64. Concentrating solar collectors have difficulty in dissipating the heat concentrated onto receiver 63, given its small area. However, in a flat plate solar collector the collector area is typically enough to dissipate all the heat. Therefore, in the concentrator 61 of FIG. 9, area 64 in the concentrator 61 of FIG. 9 should be enough to dissipate all the heat without the risk of overheating. As stated above, heat dissipation is, therefore, not a problem of lack of area, but rather a problem of heat spreading from the small receiver 63 to the area of the collector 64. Improving this heat transfer may be accomplished in different ways, such as using a high-conductivity solid material, using fluids, heat pipes or other methods.

Figure 10:
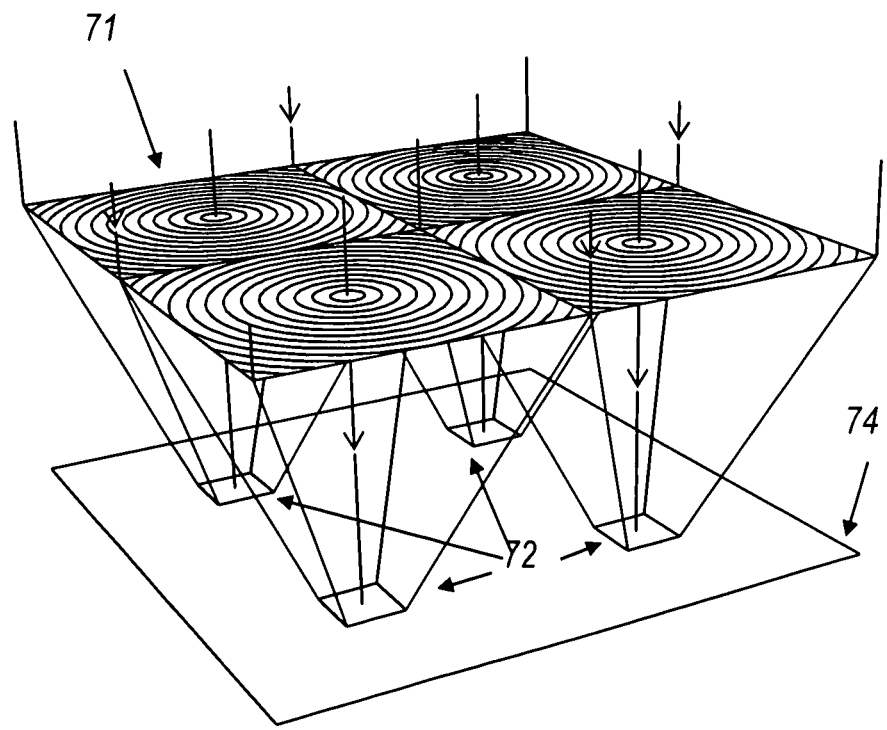
FIG. 10 shows the same collecting area as in FIG. 9, but now covered with four smaller (¼ size) concentrators and respective receivers.

FIG. 10 shows another concentrator 71 covering the same area 74 as before. The concentrator is similar to the previous one, but it is now composed of four smaller modules, each one ¼ the area (and ⅛ the volume, assuming the same angle of convergence of the rays from the optic to the receiver) of the one in FIG. 9. Instead of a single large receiver 63, we now have four smaller receivers 72, each one half the size of the receiver 63.

Figure 11:
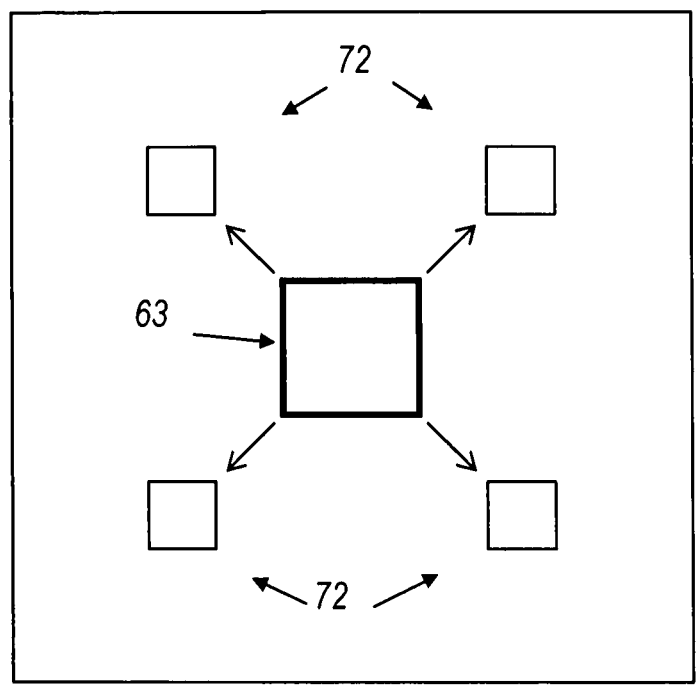
FIG. 11 shows a top view comparison of the receiver in FIG. 9 and those in FIG. 10.

FIG. 11 shows an area 64 and, superimposed for comparison, an area 74. In that area in FIG. 11, there are shown one large receiver 63 (FIG. 9) and the four small receivers 72 (FIG. 10). These four receivers cover the same area as the large one, but have twice the perimeter. If, therefore, these are immersed and have to exchange heat with a plate 64, the small receivers 72 will exchange heat faster. Increasing the contact area also increases the amount of heat exchanged between a body and its surroundings. An example of this phenomenon is, for example, the melting of a cube of ice in a cup of water. If we drop the ice cube in the water, it takes sometime to melt. If, however, we grind the ice prior to dropping it in the water, it will melt much faster. The reason for this is that the ground ice has a much larger contact surface area with the water and the heat transfer between the water and the ice occurs much faster. In the case of the solar concentrator, plate 64 would be the cup of water, receiver 63 would be the ice cube and receivers 72 would be the ground ice.

Something similar happens if 72 and 63 were heat sources, such as LEDs, assuming that the large LED 63 emits the same flux (and produces the same heat) as the four small ones 72. In that case, four small LEDs 72 would exchange heat faster than the large one since they have twice the perimeter for heat exchange with the surroundings.

Some Considerations Regarding the Use of an HSTC

The use of a heat-sinking transparent cover changes several aspects of a photovoltaic concentration module or a LED/laser system, and the heat sink is not the only one. Electrical isolation and the thermal expansion are affected as well.

Electrical Isolation

Photovoltaic concentration modules typically have numerous cells in series in order to achieve a high voltage (greater than 100 V), which improves the efficiency by lowering the current and thereby the resistive power losses. The power conditioning electronics are usually attached to the output of the photovoltaic module, as for example, a DC/AC converter, so they become less costly at lower current levels of a series arrangement of cells. It is in general also desirable to attach the cells' heat sinks to a common metal frame or metal housing. Since most heat sinks are metallic, this arrangement establishes a common electric potential for all the heat sinks. The heat sink has to have good thermal contact with the cell while also being electrically isolated therefrom. This requires the use of thin layers of electrically-insulating, thermally-conductive materials adjacent to the cells. Such materials (such as alumina and other ceramics) are expensive and difficult to apply without any voids or air bubbles forming between the cell and the heat sinks. Further, these materials are typically the first to fail in electrical isolation tests, while their mediocre thermal conductivity restricts the thermal path between the cell and the ambient.

In the present embodiment, an electrically insulating fluid, such as a mineral oil, can be in thermal contact with the cell without any of the previous problems. The heat sinks 34 are sufficiently insulated from each other by the mineral oil that each heat sink can adopt the local voltage of the back side electrode of its associated photovoltaic cell 36. The heat sink 34 can then be in direct thermal contact with the cell 36, without the need for it to be insulated electrically.

Fluid Thermal Expansion

Fluid thermal expansion imposes new constraints upon the heat sink design. The coefficients of thermal expansion of liquids are much greater than those of solids. As the device heats up, the fluid tends to expand and needs to find some extra space in case of liquids. A volume variation of 5-10% for a temperature variation of 100° C. is to be expected for liquids. Several approaches are possible to deal with this fluid-volume increase.

An option is to have a vacuum chamber separated from the main body of the liquid by a thin tube. In that case, the HSTC would be filled with liquid at or above maximum operating temperature and sealed. As the fluid cools down, it creates a vacuum that will be filled with the expanding fluid during normal operation. To the extent that the fluid contains any volatile component, the "vacuum" will contain gas or vapor at low pressure. Alternatively, the cavity can be incompletely filled with liquid, and the remaining air can be extracted after filling and the cavity then sealed. The vacuum cavity avoids possible high pressures inside the HSTC and reduces the risk of explosion. The HSTC will work always with a shallow vacuum inside, i.e., at less severe conditions, as regards the mechanical stresses on the walls, than a vacuum double glazing window pane. In order to avoid the vacuum gap moving inside the HSTC, a flexible wall enclosure can be used to trap the vacuum gap. In this approach, the volume of the enclosure changes with the pressure inside the HSTC to accommodate the fluid expansion. The enclosure can be made of metal for a longer life time, for instance of two embossed metallic sheets. In addition, the cavity may contain a small amount of air that could not economically be expelled or extracted. However, provided that at the maximum working temperature of the device the pressure in the cavity does not substantially exceed atmospheric pressure, the presence of air, gas, or vapor will typically not present a problem. References in this specification to the cavity being "filled" with the heat-spreading fluid are to be construed as including a vacuum or vapor space, or the other expedients discussed below.

Yet another option would be to have closed-cell foam immersed in the fluid. The foam contains many bubbles of gas that expand and compress as required. It could be made, for example, of PTFE, which is chemically stable and resistant to radiation. As the fluid expands, it squeezes the foam, contracting it.

Alternatively, the transparent panes bounding the fluid cavity may be flexible enough to allow the expansion of the fluid. In all cases, the cavity design takes into account the pressure changes from both temperature changes and thermal expansion.

Active Fluid Movement

Heat spreading over the HSTC can be done in several ways. One is by moving (pumping) the fluid inside the HSTC and creating a closed circuit with the aid of transparent separators that delineate the flow path.

The most capable pumps for pumping the heat-transfer fluid are Positive Displacement pumps, because in general there is no need of a high flow rate and because oils are most prominent as heat-carrier fluids.

Fluid Circuit

Actively moving the fluid can suffice to spread the heat over the aperture, in most cases, provided there are no stagnant regions of fluid. Thus it is beneficial to create a fluid circuit, such as that shown in FIG. 9.

Figure 12:
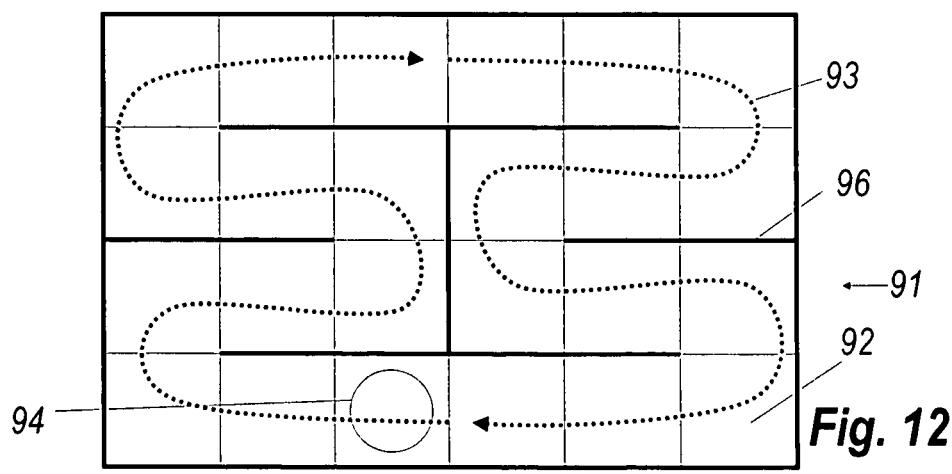
FIG. 12 is a fluid circuit diagram.

FIG. 12 shows a front view of 6×4 array 91 of units 92. Fluid flow, shown by broken curved line 93, is powered at some point around the circuit by a pump 94, and is bounded by vertical transparent separators 96 placed between the two panes. The separators 95 may to some extent degrade the optical performance of the device by absorbing, reflecting, or refracting light. However, as long as the separators are thin and no more numerous than is necessary, the degradation is typically acceptable or negligible for many applications.

External Fluid Circuit

When the heat flow is too big or the aperture area is too small, the necessary fluid temperature for dissipating the heat to the ambient, and thus the resultant cell temperature, may be too high for device longevity or efficiency. In these cases an external fluid circuit may provide sufficient extra area for heat extraction at a lower device temperature. This is similar in concept to the device known as the automotive radiator, which of course is actually a convector.

Fluid Phase Change: Heat Pipe

The phase change from liquid to vapor and vice versa introduces an extraordinarily effective way to transport heat, particularly in heat pipes, via high heat of vaporization. This heat is the equivalent of hundreds of degrees of differential temperature. Without fluid pumping the fluid moves only the under gravitational action of differential density, so that the vapor flows upwards and the liquid moves downwards. There are heat pipes in which vapor and liquid movements are dominated by capillary forces, so that their movement is not necessarily vertical. Vapor is generated at the heat source by the phase change absorbing its heat, as long as the device is above the local boiling point, which is a function of the pressure. The vapor carries the huge latent heat of the phase change from the heat source to the condensation point, which can be far away. The temperature of both vapor and liquid is close to that of the phase change. The magnitude of the heat transport does not depend on fluid temperature but on the amount of vapor (or liquid) transported. This is what makes heat pipes so attractive—their ability to transport heat without great temperature differences.

Figure 13:
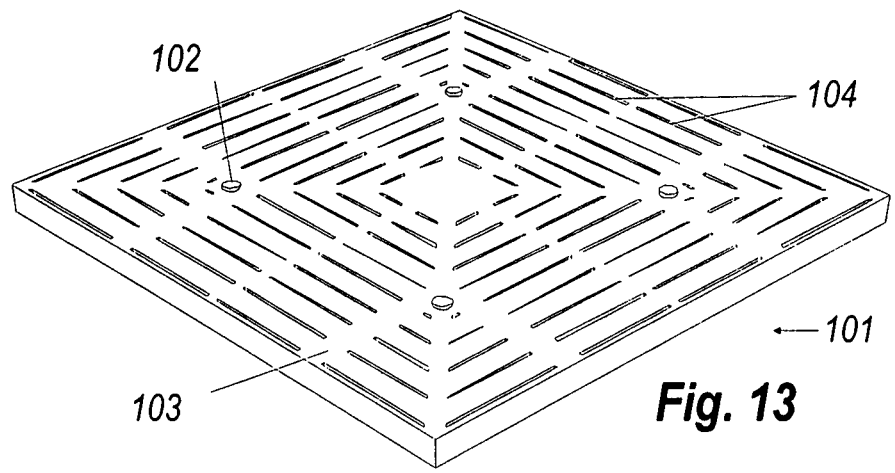
FIG. 13 is a perspective view of an embossed pane for a heat-pipe system.

One case of the capillary-based heat pipe has special interest for the present invention. FIG. 13 shows HSTC pane 101, with the other transparent pane not shown. The interior side of this transparent pane 101 has been embossed to have a non-flat face in such a way that the fluid cavity therebetween has two regions of different pane separation. The other pane is either identical to it or is a conventional flat pane, or the embossing is shared between the two panes 101 in some other way. FIG. 13 shows the embossed face of an embossed pane 101, having regions with three different heights: the highest regions 102 are in contact with the other pane and can serve as a separator of different fluid regimes. The middle regions 103 establish the thin regions of the cavity where the liquid phase will remain because of capillarity. A planar capillary is formed only where the distance between the sidewalls is small. The liquid will flow along these regions 103. The lowest regions 104 will create the thicker regions of the cavity, where the vapor phase flows.

When applied to the present devices, the fluid phase change concept introduces new problems. The surface bounding the vapor is a refractive one, which will change the system's optical behavior, and introduce optical losses in two ways: 1) by refracting the rays into undesirable directions 2) by adding Fresnel-reflection losses. Thus it is desirable that the projected areas (on the aperture) of the vapor regions be small, since these are the regions generating significant optical losses. Specifically, the issue arises from areas with a liquid/vapor interface transverse to the direction of the light passing through the cover. Because of the structure of the panel 101 the low regions 104 will typically contain liquid and vapor separated by an interface generally parallel to the plane of the plate 101, and thus approximately perpendicular to the direction of the light rays. The interface surfaces will of course be curved, because of capillary forces. This is an unfavorable configuration optically. It is best that such regions be tall and with a narrow projected area, but not so narrow that its vertical walls are close enough to allow the liquid to be kept there by capillarity. More information about this type of heat pipe can be obtained from Novel Concepts, Inc., of Las Vegas, Nev., U.S.A., found on the Internet at http://www.novelconceptsinc.com/heat-spreaders.htm (site last visited Nov. 24, 2008), incorporated herein by reference, and in K. Take, Y. Furukawa, S. Ushioda, "Fundamental Investigation of Roll Bond Heat pipe as Heat Spreader Plate for Notebook Computers", IEEE Trans. on Components and Packaging Technologies, 23, pp 80-85, 2000, incorporated herein by reference.

Glass Sealing. Metal Contacts

Figure 14:
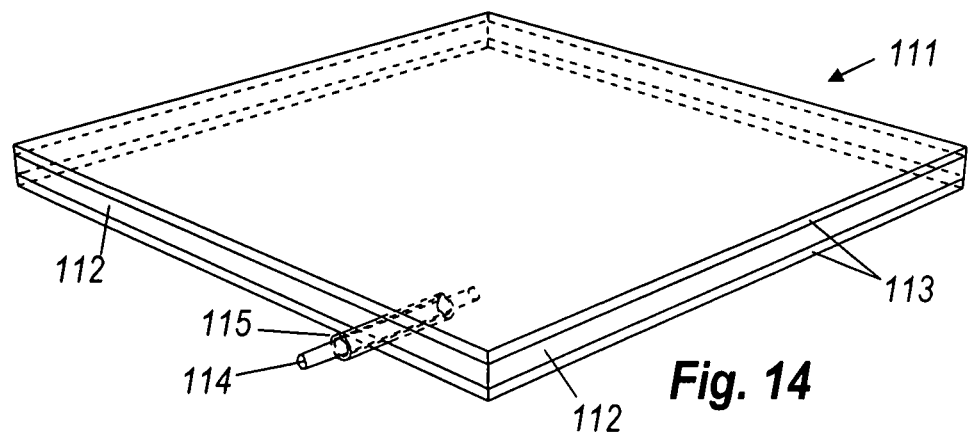
FIG. 14 is a perspective view showing the construction of a glass panel.

In many applications of the present devices, it is desirable for the final product, such as the photovoltaic concentration module or the LED lamp, to have an operating life from 5 to 30 years without any maintenance for the heat remover. This means that the fluid leakage must be infinitesimal if not zero. For this reason, the entire cavity may be made out of a single block of transparent material such as glass, so that only the electrical metal contacts cross the cavity walls. In many embodiments the contacts can be routed so that they do not need to cross the cavity walls. The metal-glass interface can be kept hermetically sealed using lamp-bulb technology for conveying the metal contacts. FIG. 14 shows an all-glass embodiment 111 of the present invention. The cavity 112 is contained in between cavity walls 113. Metallic contacts 114 establish electrical contact between the inside and outside of the sealed cavity.

This embodiment may be manufactured by using the same methods used in the fabrication of evacuated double glazing windows (see for instance N. Ng, and L. So, "A Study on Outgassing of Evacuated Glazing Under Optical Illumination" Glass Processing Days Conference Proceedings, 1 (2005) and T. Minaai, T. Sekimoto, T. Kinoshita "High thermal insulating performance and saving energy properties of vacuum glazing" Glass Processing Days Conference Proceedings, 536 (2007). Vacuum glazing consists of a pair of glass panes with an 0.2 mm thick vacuum gap between them. The edge of glass is sealed with solder glass, which has the softening temperature of about 350 C. Also, such a vacuum gap is maintained by 0.2 mm thick spacers. The internal volume is evacuated through a small pump-out tube.

Total Glass Contour

Even in embodiments such as that of FIGS. 5 to 8, in which the actual photovoltaic cell 36 is in the fluid-filled cavity, a completely unbroken glass cavity can be achieved if the electricity flow across the cavity walls is produced by electromagnetic induction. In the case of photovoltaic modules, the inductive flow can be easily achieved at the DC/AC converter, which is usually connected to the PV module. This DC/AC converter has two components: a DC to AC converter inside the cavity and an inductive AC to AC converter that has a portion inside the cavity and a portion outside the cavity, and transfers the power across the wall of the cavity. In this way, part of the AC section of the DC/AC converter is inside the cavity and the other part is outside. The heat contribution of this converter is about 10-20% of the total photovoltaic module heat generation. In the case of LED applications, a DC conditioner or an AC/DC converter are also often used. The AC part of these elements of the system can also be easily separated so the energy flow is at some point can be achieved by AC/AC electromagnetic induction. One part of the circuit will be inside the cavity and the other part will be outside.

When a pump is used, the pump can also be divided in two parts: an internal rotor containing a permanent or inductively energized magnet and an eternal stator inducing the rotor movement. In this way the cavity can be completely surrounded by glass, which eliminates or greatly limits any possibility of fluid leakage.

Automotive Applications

Conventional automotive head lamps rely on the heat produced by the incandescent lamp to defrost the head lamp cover, and to prevent interior condensation. In the case of LED head lamps for which heat is extracted on the inboard side of the lamp, there may eventuate the absurd situation in which an additional defrosting heater is needed at the head lamp aperture. Embodiments of the present invention, such as the head lamp shown in FIGS. 2 and 3, eliminate this additional component because the heat produced by the LEDs is extracted through the aperture, so that there will be no condensation upon it.

Fluid Candidates

The fluid selection depends on the cost, thermal properties, stability, and in some configurations also electrical insulating properties. Possible candidates are water, oils (particularly clear mineral oils, used in the food and pharmaceutical sectors) and alcohols, alone or mixed with water. Gases at high pressure are also candidates when the amount of heat to be extracted is modest and when the design of the heat spreader allows the pressure to be supported without excessively thick walls.

Although specific embodiments have been described, the skilled reader will understand how features of different embodiments may be combined and substituted, and such combinations are within the scope of the present invention.

For further background information, reference is made to the following patents:

Led Cooling

U.S. Pat. No. 5,890,794 by Abtahi, et. al., Apr. 6, 1999

U.S. Pat. No. 6,490,389 by Shie, et al., Nov. 12, 2002

U.S. Pat. No. 6,815,274 by Dry, Nov. 9, 2004

U.S. 2006/0176699 by Crunk, Aug. 10, 2006

U.S. Pat. No. 7,108,400 by Yamada, Sep. 19, 2006

U.S. Pat. No. 7,138,659 by Raos, Nov. 21, 2006

U.S. Pat. No. 7,219,715 by Popovich, May 22, 2007

U.S. Pat. No. 7,285,445 by Owen, Oct. 23, 2007

U.S. Pat. No. 7,288,796 by Dry, Oct. 30, 2007
U.S. Pat. No. 7,315,049 by Raos, Jan. 1, 2008

Solar

U.S. Pat. No. 4,045,246 by Mlavsky et al., Aug. 30, 1977

Vacuum Double Glazing

U.S. Pat. No. 6,689,241 by David Delhorme, Feb. 10, 2004

We claim:

1. An optoelectronic device comprising an optoelectronic chip, a transparent fluid in thermal contact with the chip, an optical system coupling said chip to an aperture larger than the chip that allows the passage of light, and a transparent cover over said aperture, said cover with a fluid passage communicating with said chip and containing said fluid such as to establish circulation conveying heat from said chip to said cover.

2. The device of claim 1 wherein said transparent cover comprises two matching half-pieces, said half-pieces also comprising fluid-containing walls configured so as to establish a convective loop within said transparent cover.

3. The device of claim 1, wherein in operation the fluid circulates by natural convection driven by waste heat from the optoelectronic chip.

4. The device of claim 1, further comprising a pump within the fluid passage.

5. The device of claim 1, wherein the fluid and the fluid passage together form a heat pipe.

6. The device of claim 1, wherein the optical system comprises a concave mirror facing the aperture and the chip, and disposed to focus collimated light entering the aperture towards the chip, or to direct light from the chip into a beam emerging through the aperture.

7. The device of claim 1, further comprising a refractive element, wherein the chip is within the refractive element, and the chip is in thermal contact with a heat spreader, and the heat spreader is in thermal contact with the fluid in the passage.

8. An optoelectronic device comprising:
an optoelectronic chip;
an optical system optically coupling said chip to an entry or exit aperture larger than the chip;
a transparent cover over said aperture, said cover having a cavity communicating thermally with said chip and containing a transparent fluid that in operation is movable within the cavity to establish circulation conveying heat from said chip to said cover.

9. The device of claim 8, wherein said transparent cover comprises inner and outer walls spaced a uniform thickness from each other.

10. The device of claim 9, further comprising partition walls between said inner and outer walls configured to establish a circulation loop within said transparent cover.

11. The device of claim 8, wherein in operation the fluid circulates by natural convection driven by waste heat from the optoelectronic chip.

12. The device of claim 8, further comprising a pump within the fluid passage.

13. The device of claim 8, wherein the optical system comprises a concave mirror facing the aperture and the chip, and disposed to focus collimated light entering the aperture towards the chip, or to direct light from the chip into a beam emerging through the aperture.

14. The device of claim 8, further comprising a refractive element, wherein the chip is within the refractive element, and the chip is in thermal contact with a heat spreader, and the heat spreader is in thermal contact with the fluid in the cavity.

15. An optoelectronic device comprising:
an optoelectronic chip;
a concave mirror optically coupling said chip to an entry or exit aperture larger than the chip, the mirror facing the aperture and the chip, and disposed to focus collimated light entering the aperture towards the chip, or to direct light from the chip into a beam emerging through the aperture;
the chip being to one side of the aperture, and the mirror being spaced from the aperture on the said one side of the aperture and closer to the aperture on the other side of the aperture; and
a heat spreader extending between the mirror and the aperture on the said one side of the aperture, the chip being mounted on the inside of the heat spreader.

16. The device of claim 15, further comprising a transparent cover over said aperture, said cover having a cavity communicating thermally with said heat spreader and containing a transparent fluid that in operation is movable within the cavity to establish circulation conveying heat from said chip to said cover.

17. The device of claim 16, wherein said transparent cover comprises inner and outer walls spaced a uniform thickness from each other.

18. The device of claim 15, further comprising a refractive element, wherein the chip is within the refractive element, and the chip is in thermal contact with the heat spreader.

* * * * *